(12) United States Patent
Takemoto et al.

(10) Patent No.: US 9,035,470 B2
(45) Date of Patent: May 19, 2015

(54) SUBSTRATE AND SEMICONDUCTOR DEVICE

(71) Applicant: OLYMPUS IP SERVICES CO., LTD., Tokyo (JP)

(72) Inventors: Yoshiaki Takemoto, Tokyo (JP); Yuichi Gomi, Tokyo (JP); Chihiro Migita, Tokyo (JP); Hiroshi Kikuchi, Hidaka (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 13/845,730

(22) Filed: Mar. 18, 2013

(65) Prior Publication Data

US 2013/0256889 A1    Oct. 3, 2013

(30) Foreign Application Priority Data

Mar. 29, 2012    (JP) .................................. 2012-075927

(51) Int. Cl.
*H01L 29/40* (2006.01)
*H01L 23/48* (2006.01)
*H01L 21/18* (2006.01)
*H01L 23/00* (2006.01)

(52) U.S. Cl.
CPC .............. *H01L 23/48* (2013.01); *H01L 21/185* (2013.01); *H01L 24/12* (2013.01); *H01L 24/25* (2013.01); *H01L 24/17* (2013.01); *H01L 24/00* (2013.01)

(58) Field of Classification Search
USPC ...................... 257/E21.088, E21.48, E21.519, 257/E21.567, 776, 777, 782, 785, 780, 734, 257/737, 741, 747, 748, 750, 758, 762, 766, 257/773, 786, 688, 685, 689; 438/455, 456, 438/457, 458, 578, 605, 666
See application file for complete search history.

(56) References Cited

U.S. PATENT DOCUMENTS 6,097,097 A *    8/2000    Hirose .......................... 257/778
2011/0133185 A1*    6/2011    Wakisaka ....................... 257/48
2012/0091597 A1*    4/2012    Kwon et al. ................... 257/777

FOREIGN PATENT DOCUMENTS

JP    2009-158764 A    7/2009

* cited by examiner

*Primary Examiner* — Julio J Maldonado
*Assistant Examiner* — Cory Eskridge
(74) *Attorney, Agent, or Firm* — Westerman, Hattori, Daniels & Adrian, LLP

(57) ABSTRACT

A substrate includes a base member having a predetermined thickness, and an electrode array provided in one surface in a thickness direction of the base member and having a plurality of electrodes arranged two-dimensionally in a plan view, and the electrode array includes a central portion and an incremental region provided around the central portion in the planar view and is formed so that a height of the electrodes in the incremental region gradually increase as approaching toward the central portion.

9 Claims, 7 Drawing Sheets

SUBSTRATE AND SEMICONDUCTOR DEVICE

BACKGROUND OF THE INVENTION

1. Field of the Invention

The present invention relates to a substrate, and more specifically, to a substrate having a number of electrodes formed on a base to protrude and a semiconductor device using the substrate.

Priority is claimed on Japanese Patent Application No. 2012-075927, filed Mar. 29, 2012, the content of which is incorporated herein by reference.

2. Description of Related Art

A smaller high-performance semiconductor device has been required for a small highly functional system, and a stacked semiconductor device formed by bonding wafers having a number of microelectrodes formed therein has been studied.

In such a stacked semiconductor device, it is necessary to apply a load to wafers that are bases in order to electrically connect the electrodes, but a required load increases with the number of electrodes. For example, when electrodes having a diameter of about 10 μm are formed in an entire surface of a wafer of 8 inches (23.2 cm), the number of electrodes is hundreds of millions and a load required for bonding is several tons. If such a load is concentrated on specific electrodes, the electrodes or the wafer may be damaged.

Generally, it is said that if electrodes are formed as a two-dimensional array in a region having a predetermined area, there is a tendency for a greater stress to be applied to electrodes located in a peripheral portion of the two-dimensional array at the time of bonding of wafers. Presence of a region in which there are no other electrodes around the electrodes in the peripheral portion and difficulty in sharing a load in the region with the other electrodes may be considered factors contributing to this tendency.

A method of forming dummy electrodes in close contact with a semiconductor substrate in a peripheral portion of the semiconductor substrate with a higher distribution density than a distribution density of electrodes in a circuit region and bonding the dummy electrodes to each other in the semiconductor substrates has been proposed in Japanese Unexamined Patent Application, First Publication No. 2009-158764.

SUMMARY OF THE INVENTION

A substrate according to a first aspect of the present invention includes a base member having a predetermined thickness, and an electrode array provided in one surface in a thickness direction of the base member and having a plurality of electrodes arranged two-dimensionally in a planar view. The electrode array includes a central portion and an incremental region provided around the central portion in the planar view and is formed so that a height of the electrodes in the incremental region gradually increase as approaching toward the central portion.

According to a second aspect of the present invention, in the substrate according to the first aspect of the present invention, a width of the incremental region may be 200 micrometers or more and the incremental region may be provided around the central portion.

Further, according to a third aspect of the present invention, in the substrate according to the first or second aspect of the present invention, at least one of a diameter and a formation pitch of the electrodes may be set to 20 micrometers or less.

Further, according to a fourth aspect of the present invention, in the substrate according to any one of the first to third aspects of the present invention, the height of the electrodes in the incremental region may be 80% or more of the height of the electrodes formed in the central portion.

According to a fifth aspect of the present invention, the substrate according to any one of the first to fourth aspects of the present invention may further include a wiring provided in the base.

Further, according to a sixth aspect of the present invention, in the substrate according to the fifth aspect of the present invention, the electrodes formed in the electrode array may include circuit electrodes connected to the wiring, and dummy electrodes not connected to the wiring and arranged on the outer side of the circuit electrodes in the plan view.

According to a seventh aspect of the present invention, the substrate according to the first aspect of the present invention may be formed of a semiconductor or an insulator.

Further, according to an eighth aspect of the present invention, in the substrate according to the first aspect of the present invention, the electrode may be formed of one of gold, copper, nickel, and an alloy containing at least one of such metals.

Further, according to a ninth aspect of the present invention, in the substrate according to the eighth aspect of the present invention, the electrodes may be formed by plating.

Further, according to a tenth aspect of the present invention, in the substrate according to the ninth aspect of the present invention, the electrodes may be formed by electroless plating.

Further, according to an eleventh aspect of the present invention, the substrate according to the first aspect of the present invention may further include a semiconductor element provided in the base member.

Further, according to a twelfth aspect of the present invention, a semiconductor device is formed by bonding at least two substrates having an electrode portion formed therein, and at least one of the substrates is a substrate according to any one of the first to eleventh aspects of the present invention.

BRIEF DESCRIPTION OF THE DRAWINGS

An upper part of FIG. 1 is a planar view illustrating a substrate according to an embodiment of the present invention, and a lower part is a view illustrating an operation in which the substrate is bonded.

DETAILED DESCRIPTION OF THE INVENTION

An embodiment of the present invention will be described with reference to FIGS. 1 to 7B.

Figure 1:
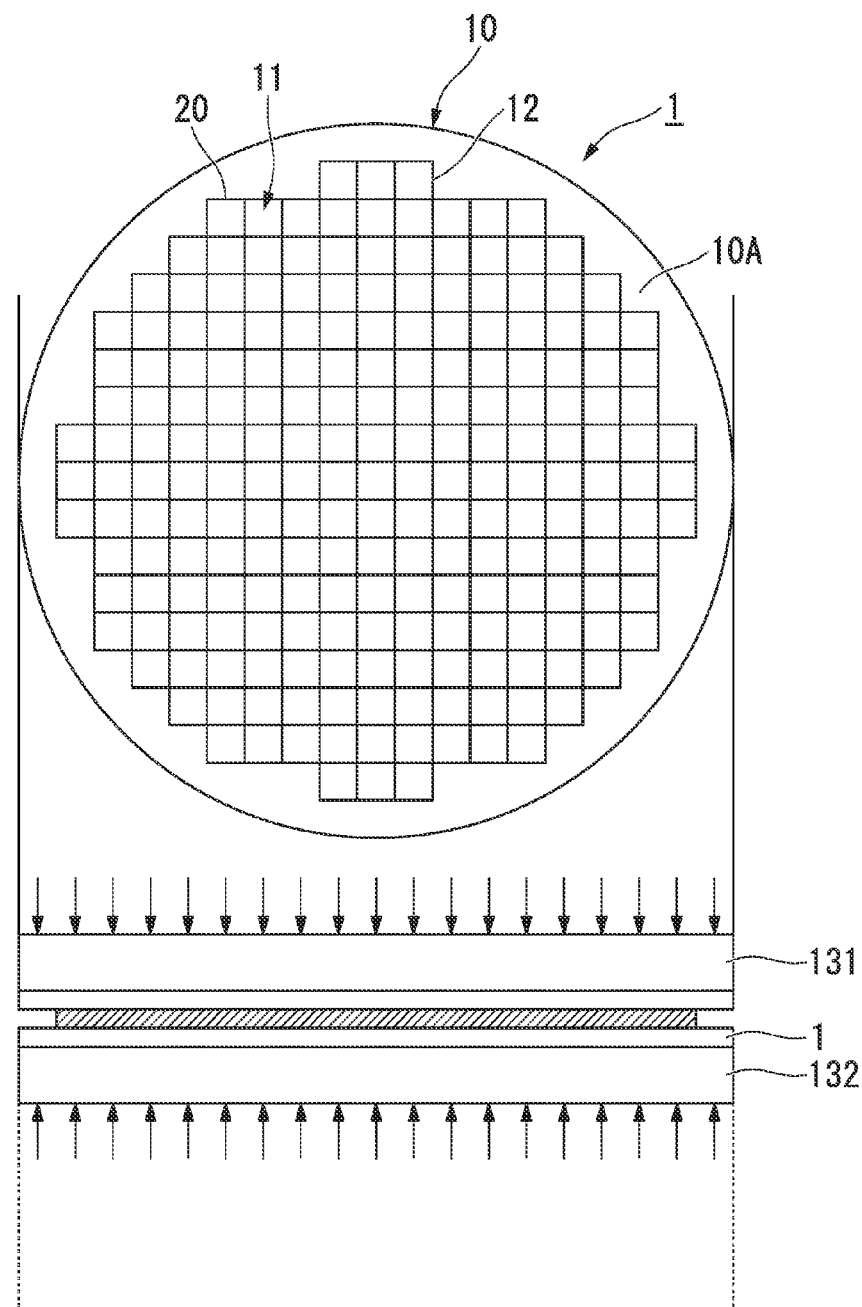

An upper part of FIG. 1 is a plan view illustrating a substrate 1 of the present embodiment. The substrate 1 includes a plate-shaped or sheet-shaped base member 10, and a plurality of electrode arrays 20 formed on a surface of the base member 10.

The base member 10 is formed of an insulator or a semiconductor in a plate or sheet shape having a predetermined thickness. Examples of the insulator and the semiconductor forming the base member 10 may include silicon, resin, ceramics, and glass, etc. In the present embodiment, a silicon wafer is used as the base member 10.

Further, although not illustrated, a wiring electrically connected to the electrode arrays 20 is formed in the base member 10. An aspect of the wiring may be formed in one surface or both surfaces in a thickness direction of the base member 10 by printing, etching or the like or may be formed to penetrate the base member. Further, the wiring may be a three-dimensional wiring using laminating technology, or may be an appropriate combination thereof.

One surface of the base member 10 is a bonded surface 10A that is bonded to the other substrate. In the bonded surface 10A, a plurality of rectangular unit regions 11 are provided. In each unit region 11, one electrode array 20 having a plurality of electrodes formed in the same layout is formed, and the same aspect of wiring is formed.

Figure 2:
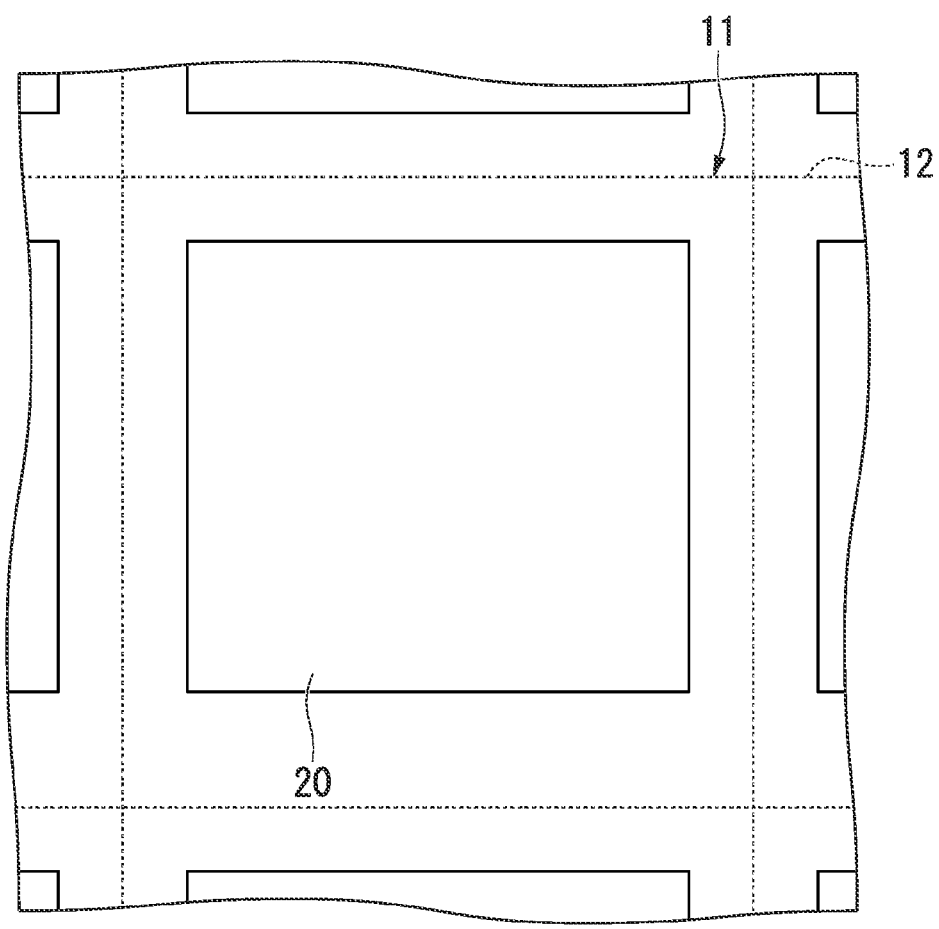
FIG. 2 is an enlarged view illustrating a unit region of the substrate.

FIG. 2 is a schematic view illustrating the enlarged unit region 11. The electrode array 20 is formed in a substantially rectangular shape in a plan view of the substrate 1 as a plurality of protruding fine electrodes are two-dimensionally arranged on the base member 10. A boundary line 12 with an adjacent unit region is a cutting line at the time of separation, which will be described later, i.e., a so-called scribe line. However, the boundary line is a conceptual line and need not necessarily be linearly-formed on the base member 10.

Figure 3A:
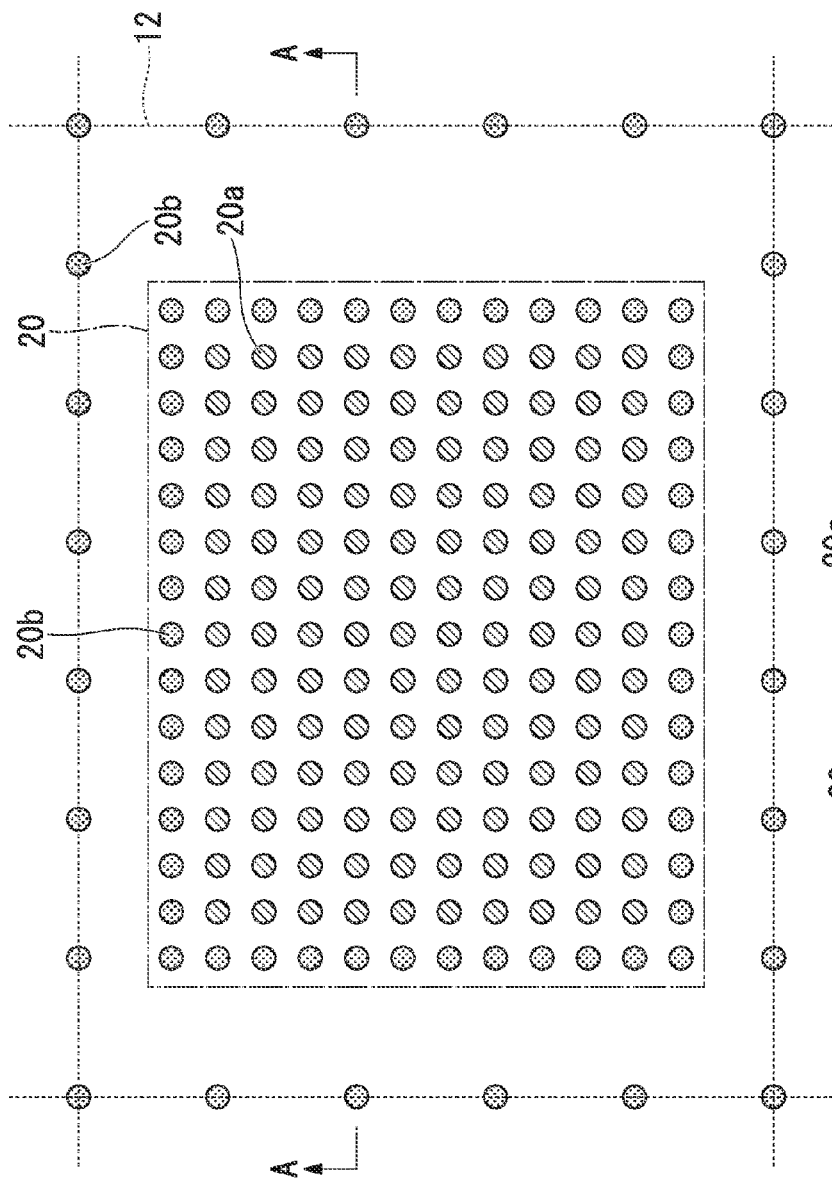
FIG. 3A is a view schematically illustrating an arrangement aspect of electrodes in the unit region.
Figure 3B:
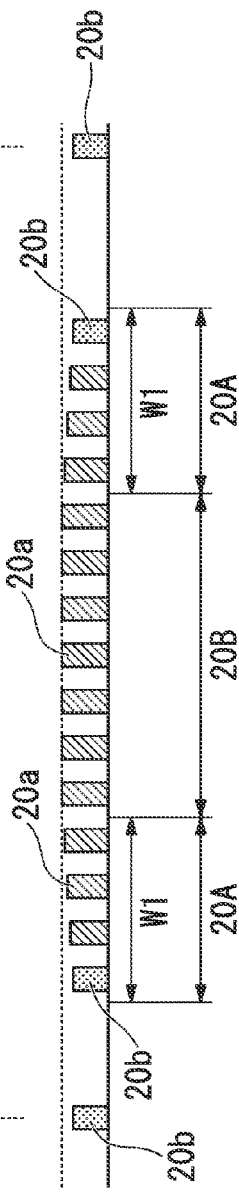
FIG. 3B is a cross-sectional view taken along line A-A of FIG. 3A.

FIG. 3A is a view schematically illustrating an arrangement aspect of the electrodes in the unit region 11. FIG. 3B is a cross-sectional view taken along line A-A of FIG. 3A. In the electrode array 20, two types of electrodes, that is circuit electrodes 20a connected to the wirings and dummy electrodes 20b not connected to the wirings, are provided. In the electrode array 20, the dummy electrodes 20b are arranged in an outermost periphery, and the circuit electrodes 20a are arranged to be surrounded by the dummy electrodes 20b. In a region outside the electrode array 20, the dummy electrodes 20b are aligned and arranged at equal intervals along the boundary line 12.

Both the circuit electrodes 20a and the dummy electrodes 20b are formed of a conductive material, such as a metal. It is desirable for the circuit electrodes 20a and the dummy electrodes 20b to be formed of any of gold, copper, nickel, and an alloy containing at least one of such metals. Further, both the circuit electrodes 20a and the dummy electrodes 20b may be suitably formed by plating, such as electroless plating.

The dummy electrodes 20b may be connected to portions that do not perform signal exchange, such as a power supply and a ground.

As illustrated in FIG. 3B, heights of the electrodes of the electrode array 20 are lowest in the periphery of the electrode array 20 and gradually increase with an increasing distance from the periphery in an incremental region 20A within a range of a predetermined distance W1 from the periphery. Further, the heights are substantially constant and are greatest in a region of the central portion 20B that is W1 or more away from the periphery.

For precision in forming fine electrodes whose diameter or formation pitch is 20 µm or less by plating, if a larger resist layer than the electrode array is formed and electrodes of the electrode array are collectively formed by plating, growth of the electrodes in the periphery of the array is slowest and a growth rate gradually increases with an increasing distance from the periphery within a range of 200 µm from the periphery. Further, when the distance from the periphery further increases, the growth rate is substantially constant. As a result, in the formed electrode array, the electrodes exhibit a height distribution as illustrated in FIG. 3B. The height of the electrode in the periphery of the array in which the height is smallest is about 80% of a maximum height.

Figure 4:
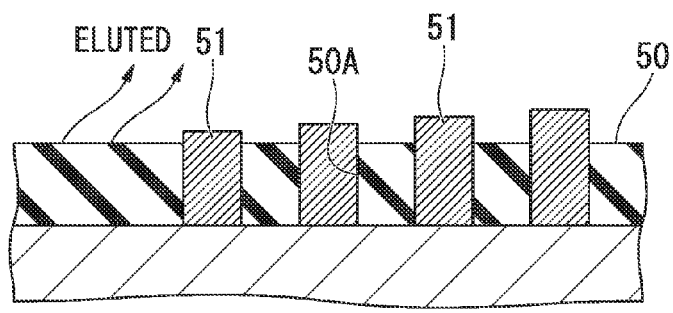
FIG. 4 is a view illustrating a relationship between growth of electrodes and a resist layer.

One factor of this phenomenon may be considered to be that components of resist eluted in a plating solution act to suppress the growth of plating. That is, in the periphery of the electrode array, a lot of resist layers 50 in which openings 50A for forming the electrode 51 are not formed exist as illustrated in FIG. 4, and as a result, the eluted components of the resist layer 50 increase, which may be considered to suppress the growth of the electrodes 51.

Accordingly, when the electrode array is formed, the resist layer is formed so that a region having a predetermined width, such as about 100 µm, in which the openings are not formed remains around the electrode array, and the electrodes of the electrode array are collectively formed, thus forming the electrode array 20 whose electrodes have a height distribution as illustrated in FIG. 3B.

Since components eluted from the resist layer described above have the same degree of influence on the dummy electrodes 20b formed along the boundary line 12 and the dummy electrodes 20b arranged in the outermost periphery of the electrode array 20, the dummy electrodes 20b are formed with the same heights. The dummy electrodes 20b formed along the boundary line 12 may be formed simultaneously with the electrodes of the electrode array 20 or may be formed through a process separate from the electrode array 20.

If at least two substrates are integrally bonded as illustrated in a lower part of FIG. 1 through a combination of the substrates 1, the substrate 1 and a substrate having a semiconductor element formed therein, or the substrates 1 having a semiconductor element formed therein, it is possible to form a semiconductor device. Specifically, if the substrates are interposed between pressuring plates 131 and 132 in a state in which the bonded surfaces 10A of the substrates oppose each other, and bonded through pressing and heating bonding using a pressing apparatus, which is not illustrated, the opposing electrodes are electrically connected to each other, thus forming a semiconductor device.

A known wafer bonding apparatus or the like may be used to position the substrates at the time of bonding. Further, prior to bonding, the base surface and the electrode portions of each substrate may be cleaned by plasma cleaning, reverse sputtering or the like, and the electrodes may be bonded using so-called surface activation.

Figure 5:
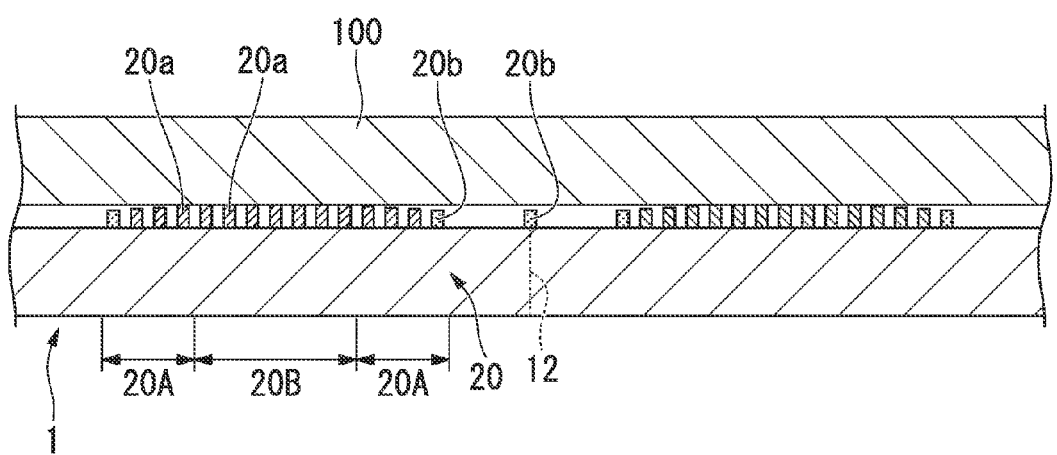
FIG. 5 is a view illustrating a process when substrates are bonded.

FIG. 5 is a view illustrating a contact state of the electrode array 20 at the time of wafer bonding. In the electrode array 20 formed in the substrate 1 of the present embodiment, since the circuit electrodes 20a in a central portion 20B are formed to be highest, the circuit electrodes 20a are in contact with the other substrate 100. At this time, the dummy electrodes 20b in the array periphery in which it is easiest for a stress to be applied are not yet in contact with the substrate 100 and the stress is not applied.

A greater stress is applied to the circuit electrodes 20a located in the periphery among the circuit electrodes 20a in the central portion 20B arranged in the rectangular shape than to the other electrodes. However, when the substrate 100 located outside the central portion 20B is bent due to the stress, the slightly lower circuit electrodes 20a located in the incremental region 20A just outside the central portion 20B come in contact with the bent substrate 100. This prevents a great stress from being continuously applied to the electrodes in the periphery of the central portion 20B. Further, when the substrate 100 located in the outside of the central portion 20B is bent due to the applied stress, the electrodes in the incremental region 20A are brought into sequential contact with the substrate 100 according to the similar behavior, and thus the circuit electrodes 20a are bonded while preventing a great stress from being continuously applied to specific ones of the electrodes.

Finally, the dummy electrodes 20b located in the outermost periphery of the electrode array 20 and the dummy electrodes 20b arranged along the boundary line 12 come in contact with the bent substrate 100, completing bonding to the other substrate 100. At a time point at which the dummy electrodes 20b come in contact with the substrate 100, bonding of substantially all the circuit electrodes 20a ends. As a result, since a shape of the substrate 100 is stabilized, a great stress is not applied to the dummy electrodes 20b.

Figure 6:
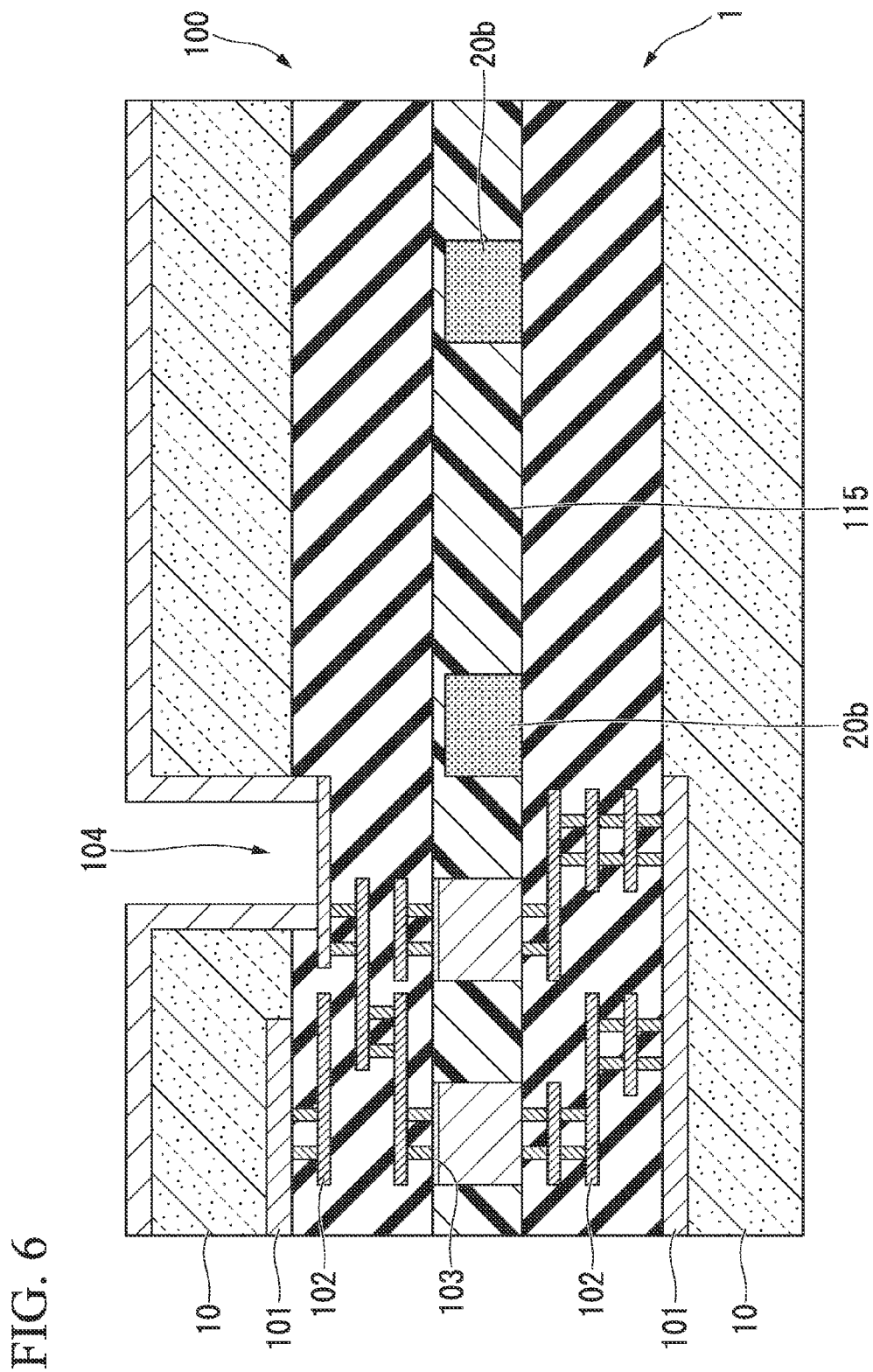
FIG. 6 is a cross-sectional view illustrating an example of a region near a boundary line after the substrates have been bonded.

After bonding of the substrates has been completed, a resin is injected into a gap between the substrates to protect the bonded circuit electrodes 20a. FIG. 6 is a view illustrating an example of a cross section near the boundary line in the substrate after a resin 115 has been injected. In this example, both of the substrate 1 and the other substrate 100 include, on the base 10, a semiconductor element 101 formed by impurity doping and a three-dimensionally formed wiring 102. Further, the electrodes of the substrate 100 are flat electrode pads 103 formed on the wirings 102.

In the incremental region 20A, since the heights of the circuit electrodes 20a gradually decrease with a decreasing distance from the periphery, any one of the substrate 1 and the other substrate 100 is slightly bent and the circuit electrode 20a and the electrode pad 103 are bonded. However, since this bend is as very small as less than 1 μm, both of the substrates are illustrated as being flat in FIG. 6. Further, since there are no electrode pads on the other side to be bonded to the dummy electrodes 20b, the dummy electrodes 20b are not in contact with the substrate 100 after a load is released.

A hole reaching into the wiring 102 is formed as an external electrode extraction portion 104 for connecting an external terminal to the wiring 102, in a surface opposite to the bonded surface of the other substrate 100. The external electrode extraction portion 104 may be filled with a conductive material, such as a metal.

Figure 7A:
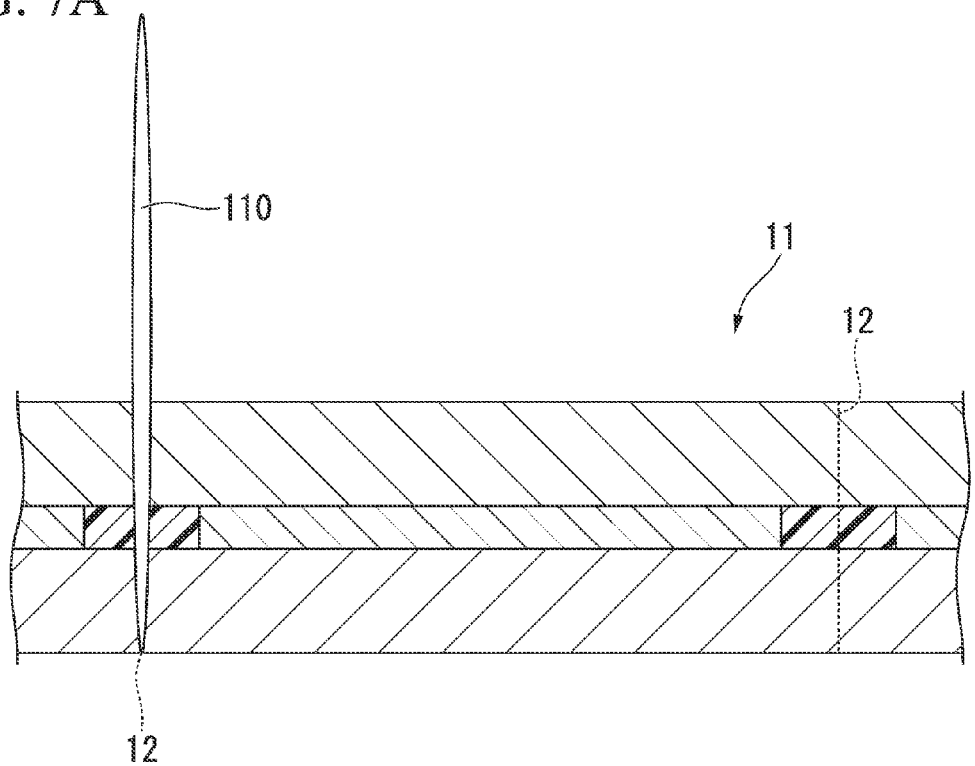
FIG. 7A is a view illustrating a process for separation.
Figure 7B:
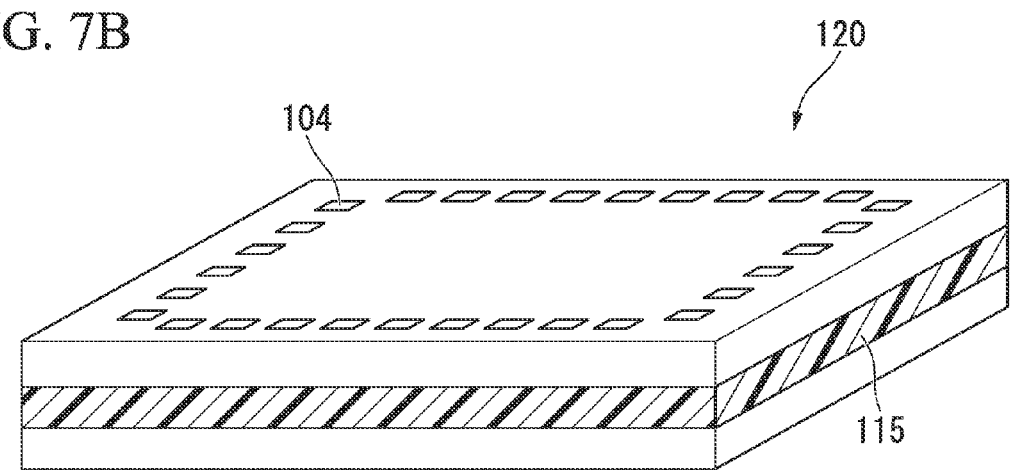
FIG. 7B is a perspective view illustrating a unit region cut as a semiconductor device.

After the substrates have been bonded, the bonded substrates are cut into unit regions 11 along the boundary line 12 using a blade 110 or the like (separation), as illustrated in FIG. 7A. Thus, a semiconductor device 120 sealed with the resin 115 is completed, as illustrated in FIG. 7B.

As described above, according to the substrate 1 of the present embodiment, the electrode array 20 includes the central portion 20B and the incremental region 20A and, in the incremental region 20A, the electrodes are formed so that the height of the electrode gradually increases with a decreasing distance from the central portion 20B. Accordingly, it is possible to suitably suppress an excessive stress from being applied to specific electrode at the time of bonding of the electrode and suitably prevent the electrode or the base from being damaged at the time of bonding, as described above.

Further, since the dummy electrodes 20b are arranged along the boundary line 12, it is possible to suitably suppress damage of the substrate, such as chipping at the time of separation and to improve the yield of manufacture of a semiconductor device.

While the embodiment of the present invention has been described above, the technical scope of the present invention is not limited to the above embodiment. A combination of components may be changed, various changes may be made to each component, or each component may be removed without departing from the scope and spirit of the present invention.

First, in the present invention, the shape of the electrode array is not limited to the rectangular shape and the shape is not particularly limited as long as the electrode array includes an incremental region having a predetermined width in the peripheral portion.

Further, the number and the arrangement aspect of the electrode array in the unit region may be appropriately set in consideration of a configuration of a semiconductor device to be manufactured.

Further, in the present invention, the dummy electrodes are not essential. Therefore, the electrode array may include only the circuit electrodes. Even in this case, since it is difficult for a great stress to be applied to the circuit electrodes arranged in the outermost periphery as described above, it is possible to obtain certain effects, although the effects would be slightly inferior to the effects of the above-described embodiment.

Even when the dummy electrodes are provided, the dummy electrodes need not be arranged only in the outermost periphery, but the dummy electrodes may be arranged in the entire incremental region or in a portion of the central portion. Further, the dummy electrodes may be arranged in a region between the boundary line and the electrode array.

Figure 8:
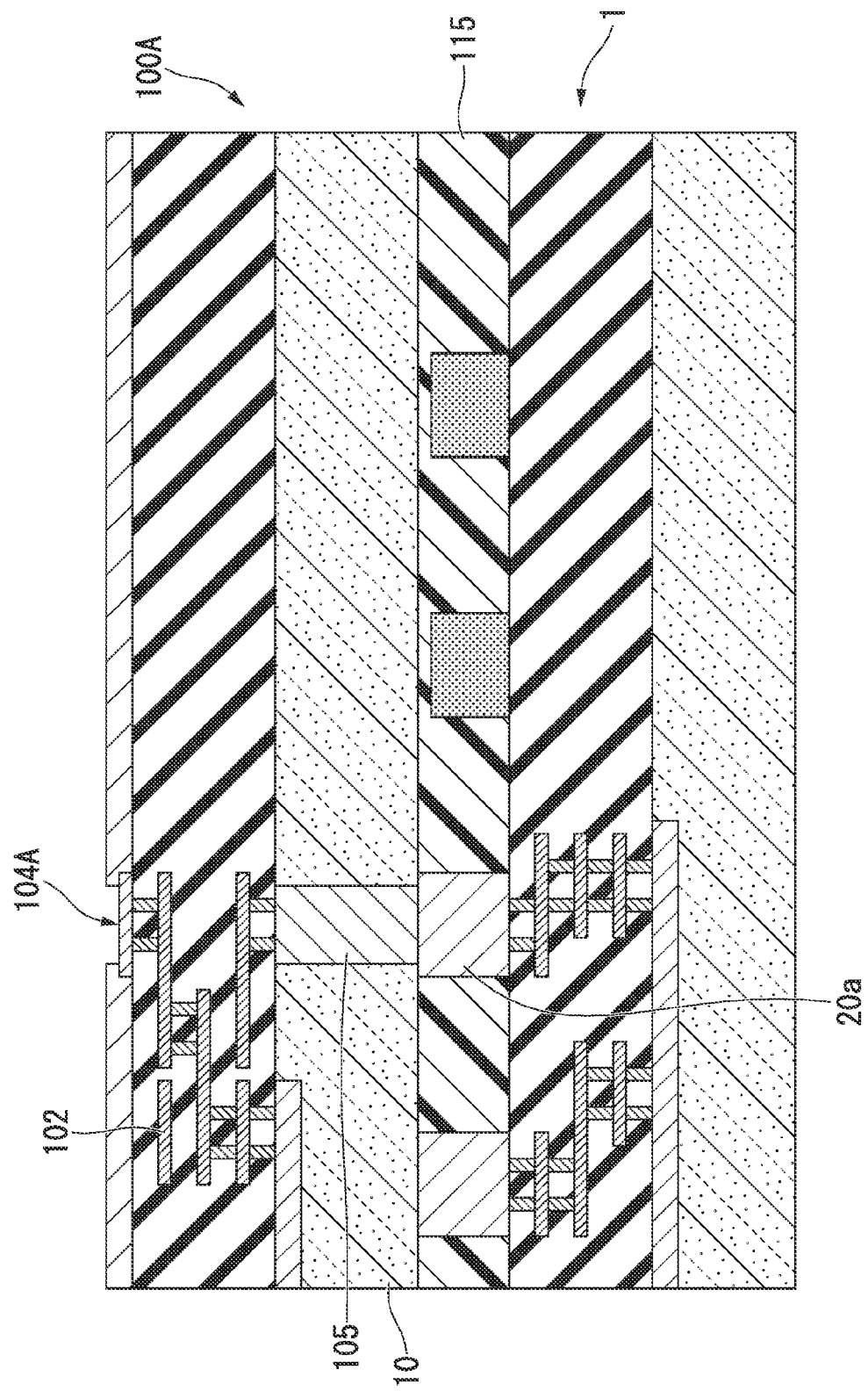
FIG. 8 is a cross-sectional view illustrating another example of a region around the boundary line after the substrate of the present invention has been bonded.

Further, as in a variant illustrated in FIG. 8, a bonded surface of the other substrate to be bonded to a substrate 1 of the present invention may not be directed to the substrate 1. That is, the substrate 1 may be bonded to a surface opposite to a surface having a wiring 102 formed therein, of the other substrate 100A. In this case, a hole reaching into the wiring 102 may be provided in a base member 10 of the other substrate 100A and filled with a conductive material to form a through electrode 105, and a circuit electrode 20a and the through electrode 105 may be bonded. Meanwhile, a portion of the wiring 102 exposed to an upper surface may be used as an external electrode extraction portion 104A as it is.

Further, three or more substrates including at least one substrate of the present invention may be bonded to form a semiconductor device.

Types of the substrates and the semiconductor device formed by bonding the substrates of the present invention are not particularly limited. However, for example, in a solid-state imaging device having a number of pixels, a large number of circuit electrodes need to be formed at a narrow pitch, for example, so that a diameter of the circuit electrode or a formation pitch of the circuit electrode is 20 micrometers. Accordingly, great merits are obtained by applying the present invention and it is very suitable to apply the structure of the present invention.

While the preferred embodiments of the present invention have been described above, the present invention is not limited to these embodiments. Addition, omission, substitution, and other modifications of the configuration are possible without departing from the scope and spirit of the present invention. The present invention is not limited by the foregoing description, but is limited only by the appended claims.

What is claimed is:
1. A substrate comprising:
a first base member having a first flat surface;
a first wiring provided in the first base member;

an electrode array provided on the first flat surface, having a plurality of electrodes arranged two-dimensionally in a planar view;
a second base member having a second flat surface, the second flat surface facing to the first flat surface and located in predetermined distance from the first flat surface; and
a second wiring provided in the second base member, wherein a first electrodes of the plurality of electrodes are located on a central portion in the planar view, wherein each of the first electrodes is electrically connected between the first wiring and the second wiring, wherein a second electrodes of the plurality of electrodes are located on an incremental region, wherein the incremental region is provided around the central portion in the planar view, wherein a height of the second electrodes gradually increase as approaching toward the central portion, wherein a height of a part of the second electrodes is smaller than the predetermined distance,
wherein the part of the second electrodes is electrically insulated from the second wiring,
wherein a third electrodes are provided on the first flat surface, which are arranged in a boundary region, wherein the boundary region is located along an edge of the first base member, and
wherein a height of the third electrodes is equal to or smaller than the height of the second electrodes.

2. The substrate according to claim 1, wherein a width of the incremental region is 200 micrometers or more.

3. The substrate according to claim 1, wherein at least one of a diameter and a formation pitch of the first electrodes is 20 micrometers or less.

4. The substrate according to claim 1, wherein the height of the second electrodes is 80% or more of the height of the first electrodes.

5. The substrate according to claim 1, wherein each of the first base member and the second base member is formed of a semiconductor or an insulator.

6. The substrate according to claim 1, wherein each of the first electrode and the second electrode is formed of one of gold, copper, nickel, and an alloy containing at least one of such metals.

7. The substrate according to claim 6, wherein the first electrode and the second electrode are formed by plating.

8. The substrate according to claim 7, wherein the first electrode and the second electrode are formed by electroless plating.

9. The substrate according to claim 1, further comprising a semiconductor element provided in the first base member.

* * * * *